United States Patent
Liu

(10) Patent No.: US 11,881,830 B2
(45) Date of Patent: Jan. 23, 2024

(54) FILTER CIRCUITS AND ASSOCIATED SIGNAL PROCESSING METHODS

(71) Applicant: Realtek Semiconductor Corp., HsinChu (TW)

(72) Inventor: Chih-Hao Liu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 461 days.

(21) Appl. No.: 17/169,535

(22) Filed: Feb. 7, 2021

(65) Prior Publication Data

US 2022/0116026 A1 Apr. 14, 2022

(30) Foreign Application Priority Data

Oct. 12, 2020 (TW) .................................. 109135183

(51) Int. Cl.
*H03K 5/00* (2006.01)
*H03H 17/02* (2006.01)
*H03K 5/01* (2006.01)

(52) U.S. Cl.
CPC .......... *H03H 17/0223* (2013.01); *H03K 5/01* (2013.01); *H03H 2017/0245* (2013.01)

(58) Field of Classification Search
CPC .......... H03H 17/0223; H03H 17/0269; H03H 17/04; H03H 2017/0081; H03H 17/06
See application file for complete search history.

(56) References Cited

U.S. PATENT DOCUMENTS

| 6,308,190 | B1 * | 10/2001 | Willson, Jr. | ....... H03H 17/0275 |
| | | | | 708/319 |
| 6,678,320 | B1 * | 1/2004 | Aydin | .................... H03H 17/06 |
| | | | | 375/140 |
| 2002/0023115 | A1 * | 2/2002 | Kanasugi | ........... H03H 17/0294 |
| | | | | 708/319 |
| 2003/0001174 | A1 * | 1/2003 | Henmi | .................. H03H 17/06 |
| | | | | 257/275 |
| 2006/0184596 | A1 | 8/2006 | Volleberg | |

FOREIGN PATENT DOCUMENTS

CN 1516923 A 7/2004

* cited by examiner

Primary Examiner — Tuan T Lam
(74) Attorney, Agent, or Firm — Winston Hsu

(57) ABSTRACT

A filter circuit includes multiple registers, a switch circuit, multiple multipliers and a summation circuit. Each register is configured to store an input. The switch circuit is coupled to the registers and configured to receive the inputs from the registers as a series of registered inputs and adjust arrangement of the inputs of the series of registered inputs to generate a series of rearranged inputs according to a count value. The count value is accumulated in response to reception of a new input of the filter circuit. The multipliers are coupled to the switch circuit. The inputs of the series of rearranged inputs are sequentially provided to the multipliers. Each multiplier is configured to generate a multiplication result according to the received input and a coefficient. The summation circuit is coupled to the multipliers and configured to sum up the multiplication results to generate an output.

12 Claims, 10 Drawing Sheets

FILTER CIRCUITS AND ASSOCIATED SIGNAL PROCESSING METHODS

BACKGROUND OF THE INVENTION

1. Field of the Invention

The invention relates to a filter circuit and an associated signal processing method, more particular to a low-power filter circuit and the associated signal processing method.

2. Description of the Prior Art

The delay tap finite impulse response (FIR) filter is a circuit frequently used in signal processing or in communication system. In the fields of communication and signal processing, the coefficients of the filter are well designed to filter out the unwanted signal, as well as to avoid phase distortion to occur during signal transmission. However, because the signal to be processed by the filter is continuously input, the filter has to be continuously triggered when the signal is input, which causes the power consumption problems. Especially, when the number of taps of the filter is large, the power consumption problem becomes more obvious because the input data has to be transferred between the registers.

To solve this problem, a novel filter circuit and the associated signal processing method are proposed.

SUMMARY OF THE INVENTION

It is an objective of the invention to provide a low-power filter circuit and the associated signal processing method.

According to an embodiment of the invention, a filter circuit comprises a plurality of registers, a switch circuit, a plurality of multipliers and a summation circuit. Each register is configured to store an input. The switch circuit is coupled to the registers and configured to receive the inputs from the registers as a series of registered inputs and adjust arrangement of the inputs of the series of registered inputs to generate a series of rearranged inputs according to a count value. The count value is accumulated in response to reception of a new input of the filter circuit. The multipliers is coupled to the switch circuit, wherein the inputs of the series of rearranged inputs are sequentially provided to the multipliers and each multiplier is configured to generate a multiplication result according to received input and a coefficient. The summation circuit is coupled to the multipliers and configured to sum up the multiplication results to generate an output.

According to another embodiment of the invention, a filter circuit comprises a plurality of registers, a switch circuit, a plurality of multipliers and a summation circuit. Each register is configured to store an input. The switch circuit is configured to adjust arrangement of a series of coefficients according to a count value to generate a series of rearranged coefficients. The count value is accumulated in response to reception of a new input of the filter circuit. The multipliers is coupled to the switch circuit and the registers and configured to receive the inputs from the registers and receive the series of rearranged coefficients from the switch circuit, wherein each multiplier is configured to generate a multiplication result according to the received input and the received coefficient. The summation circuit is coupled to the multipliers and configured to sum up the multiplication results to generate an output.

According to yet another embodiment of the invention, a signal processing method, for generating at least one output according to a plurality of inputs and a plurality of coefficients, comprises: obtaining a series of inputs and a series of coefficients, wherein the series of inputs comprises the plurality of inputs and the series of coefficients comprises the plurality of coefficients; adjusting arrangement of the series of inputs or the series of coefficients according to a count value to generate a series of rearranged inputs or a series of rearranged coefficients; sequentially multiplying the inputs comprised in the series of rearranged inputs by the coefficients comprised in the series of coefficients or sequentially multiplying the inputs comprised in the series of inputs by the coefficients comprised in the series of rearranged coefficients to generate a plurality of multiplication results; and summing up the multiplication results to generate the output.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
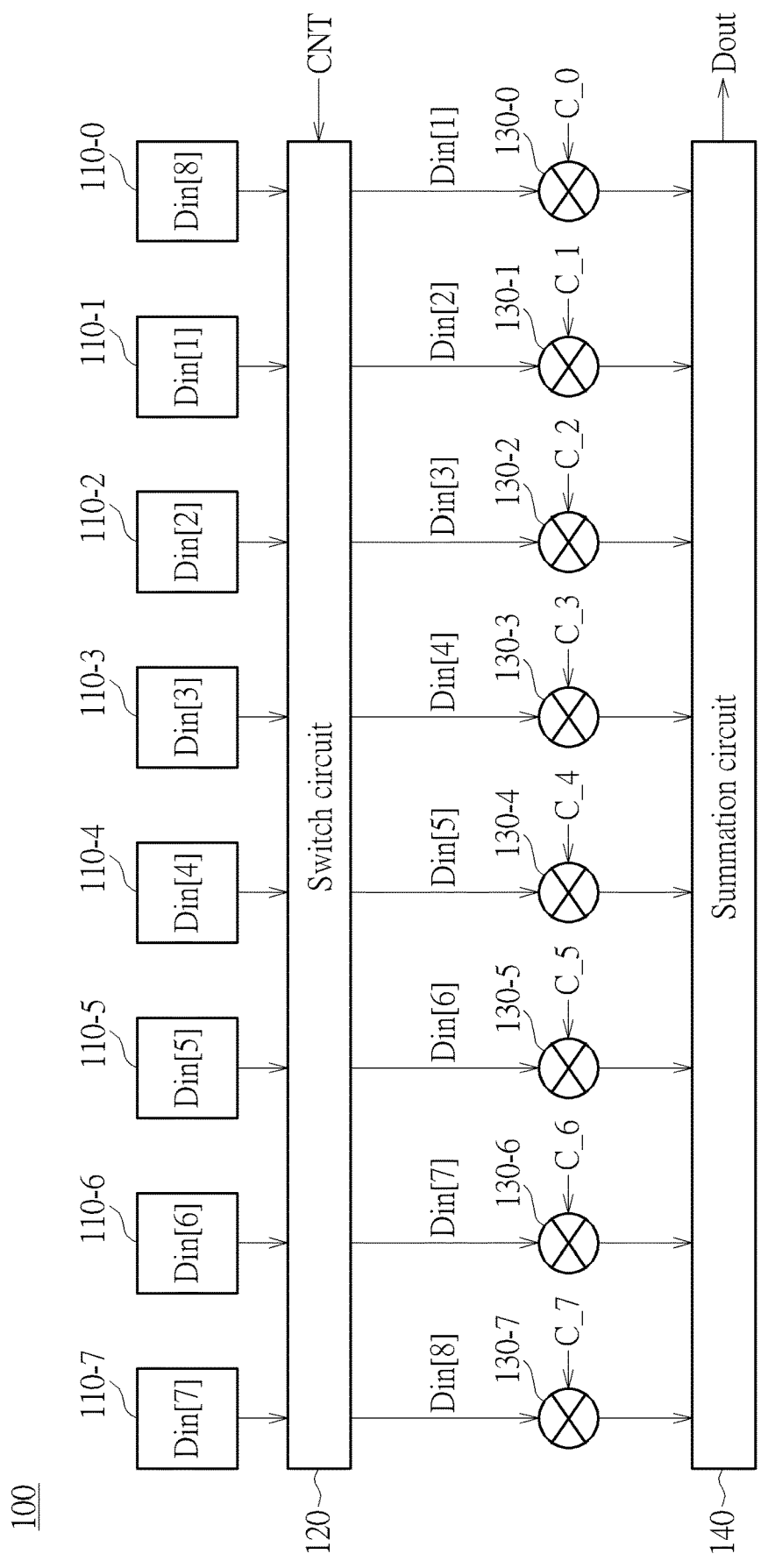
FIG. 1 is a schematic diagram of a filter circuit according to a first embodiment of the invention.

FIG. 1 is a schematic diagram of a filter circuit according to a first embodiment of the invention. The filter circuit in the embodiments of the invention may be implemented by, for example but not limited to, a delay tap FIR filter. The filter circuit 100 may comprise a plurality of registers 110-0~110-(M−1), a switch circuit 120, a plurality of multipliers 130-0~130-(M−1) and a summation circuit 140, where M is a positive integer and may be set as the number of taps of the filter circuit 100. In this embodiment, the number of taps of the filter circuit 100 is 8. Thus, M=8. Each register is configured to store an input. For example, suppose that the initial input data of the filter circuit 100 is Din[0], Din[1], Din[2], . . . and Din[7], where the 'n' of D[n] represents the index of the sampling time point. The smaller the n is, the earlier the time point. The inputs Din[0], Din[1], Din[2], . . . and Din[7] are respectively stored in the registers 110-0, 110-1, 110-2, . . . 110-7. The multipliers 130-0~130-7 may respectively multiply a received input Din[n] and a corresponding coefficient (for example, one of the coefficients C_0~C_7) together to generate a multiplication result. The summation circuit 140 is coupled to the multipliers 130-0~130-7 and configured to sum up the multiplication results to generate an output Dout.

In the first embodiment of the invention, the switch circuit 120 is coupled between the registers 110-0~110-7 and the multipliers 130-0~130-7 and is configured to receive the inputs that are currently registered in the registers from the plurality of registers as a series of registered inputs in each operation and adjust arrangement of the inputs of the series of registered inputs according to a count value CNT to generate a series of rearranged inputs. The series of rearranged inputs will be respectively provided to the multipliers 130-0~130-7 as the corresponding input Din[n] of each multiplier.

According to an embodiment of the invention, when the filter circuit 100 is activated, the count value CNT may be set to an initial value (for example, 0) and will be accumulated every time when an input data Din is input to the filter circuit 100 (for example, the count value CNT will be increased by 1 every time when the filter circuit 100 receives a new input data). When the count value CNT is smaller than the number of taps M, the switch circuit 120 does not function. The switch circuit 120 starts to function in response to the count value CNT when the count value CNT becomes not smaller than the number of taps M, and is configured to adjust arrangement of the inputs of the series of registered inputs currently obtained from the registers according to a modulo result of CNT and M (for example, an operation result of (CNT mod M)).

In the embodiments of the invention, when the filter circuit 100 receives a new input at the time when all the registers 110-0, 110-1, 110-2, . . . 110-7 have already been written with input data, the new input will be written in one of the registers, for example, the one which stores the oldest (earliest) input among the inputs currently being stored in the registers, so as to replace the oldest input. As the example shown in FIG. 1, suppose that in previous operations, the inputs Din[0]~Din[7] have been respectively stored in the registers 110-0~110-7 and the count value CNT has been accumulated to 8, the switch circuit 120 may start to function in response to this value. In the latest operation period, the input Din[8] is input to the filter circuit 100 and the count value CNT is now accumulated to 9. The input Din[8] will be written in the register 110-0 to replace the oldest input Din[0] among the currently registered inputs.

Since the operation of the filter circuit 100 is to respectively multiply the input data, in an order from the latest one to the oldest one, by the coefficients C_(M-1)~C_0 (for example, C_7~C_0 in this example), the switch circuit 120 may receive the currently registered inputs from the registers 110-0~110-7 as a series of registered inputs and adjust arrangement of the inputs of the series of registered inputs according to a modulo result of CNT and M, so that the input data will be correctly multiplied by the corresponding coefficient.

In this example, the series of registered inputs received by the switch circuit 120 is {Din[7], Din[6], Din[5], Din[4], Din[3], Din[2], Din[1], Din[8]} and the current modulo result of CNT and M is 1 (since 9 mod 8=1), the switch circuit 120 rearranges the series of registered inputs by performing one data shift to shift one data to the right in a cyclic manner (that is, adjust the arrangement of the inputs), so as to generate a series of rearranged inputs {Din[8], Din[7], Din[6], Din[5], Din[4], Din[3], Din[2], Din[1] }.

The data in this series of rearranged inputs {Din[8], Din[7], Din[6], Din[5], Din[4], Din[3], Din[2], Din[1]} will be respectively provided to the multiplier 130-7~130-0 as the corresponding input. In this manner, the latest input Din[8] and the coefficient C_7 will be multiplied together, the oldest input D[1] and the coefficient C_0 will be multiplied together, and the rest inputs will be multiplied by the corresponding coefficient as well, and the filter operation of the current operation period is completed.

Figure 2:
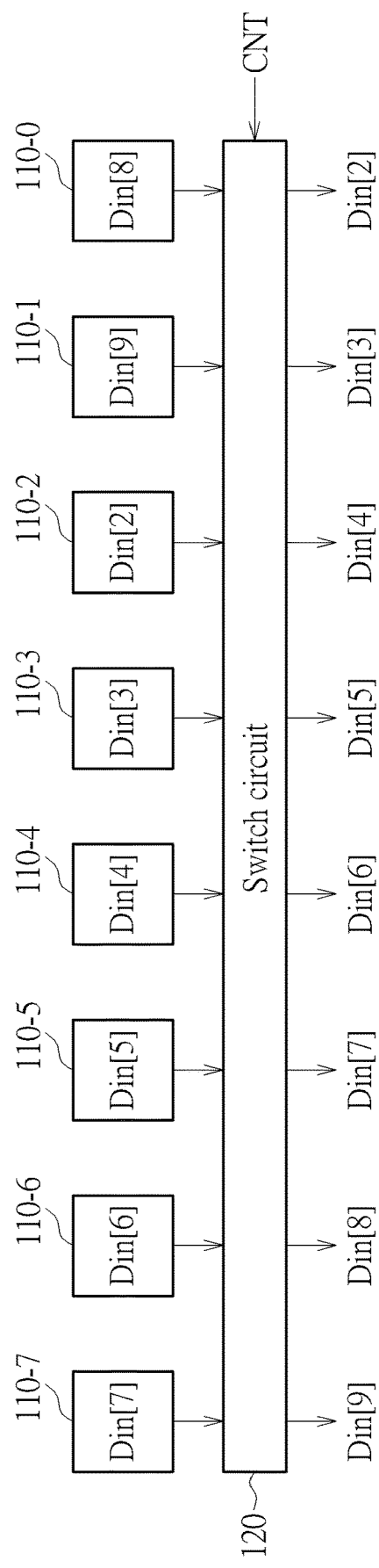
FIG. 2 is a simplified diagram showing the data rearrangement operation of the switch circuit in a next operation period according to an embodiment of the invention.

FIG. 2 is a simplified diagram showing the data rearrangement operation of the switch circuit 120 in a next operation period according to an embodiment of the invention. Similarly, in the next operation period, the input Din[9] is input to the filter circuit 100 and written in the register 110-1 to replace the oldest input Din[1] among the current registered inputs, and the count value CNT is now accumulated to 10. The switch circuit 120 receives the currently registered inputs from the registers 110-7~110-0 as a series of registered inputs and adjust arrangement of the inputs of the series of registered inputs according to the count value CNT.

In this example, the series of registered inputs received by the switch circuit 120 is {Din[7], Din[6], Din[5], Din[4], Din[3], Din[2], Din[9], Din[8]} and the current modulo result of CNT and M is 2 (since 10 mod 8=2), the switch circuit 120 rearranges the series of registered inputs by performing two data shift to shift two data to the right in a cyclic manner (that is, adjust the arrangement of the inputs), so as to generate a series of rearranged inputs {Din[9], Din[8], Din[7], Din[6], Din[5], Din[4], Din[3], Din[2]}.

The data in this series of rearranged inputs {Din[9], Din[8], Din[7], Din[6], Din[5], Din[4], Din[3], Din[2]} will be respectively provided to the multiplier 130-7~130-0 as the corresponding input. In this manner, the latest input Din[9] and the coefficient C_7 will be multiplied together, the oldest input D[2] and the coefficient C_0 will be multiplied together, and the rest inputs will be multiplied by the corresponding coefficient as well, and the filter operation of the current operation period is completed.

Figure 3:
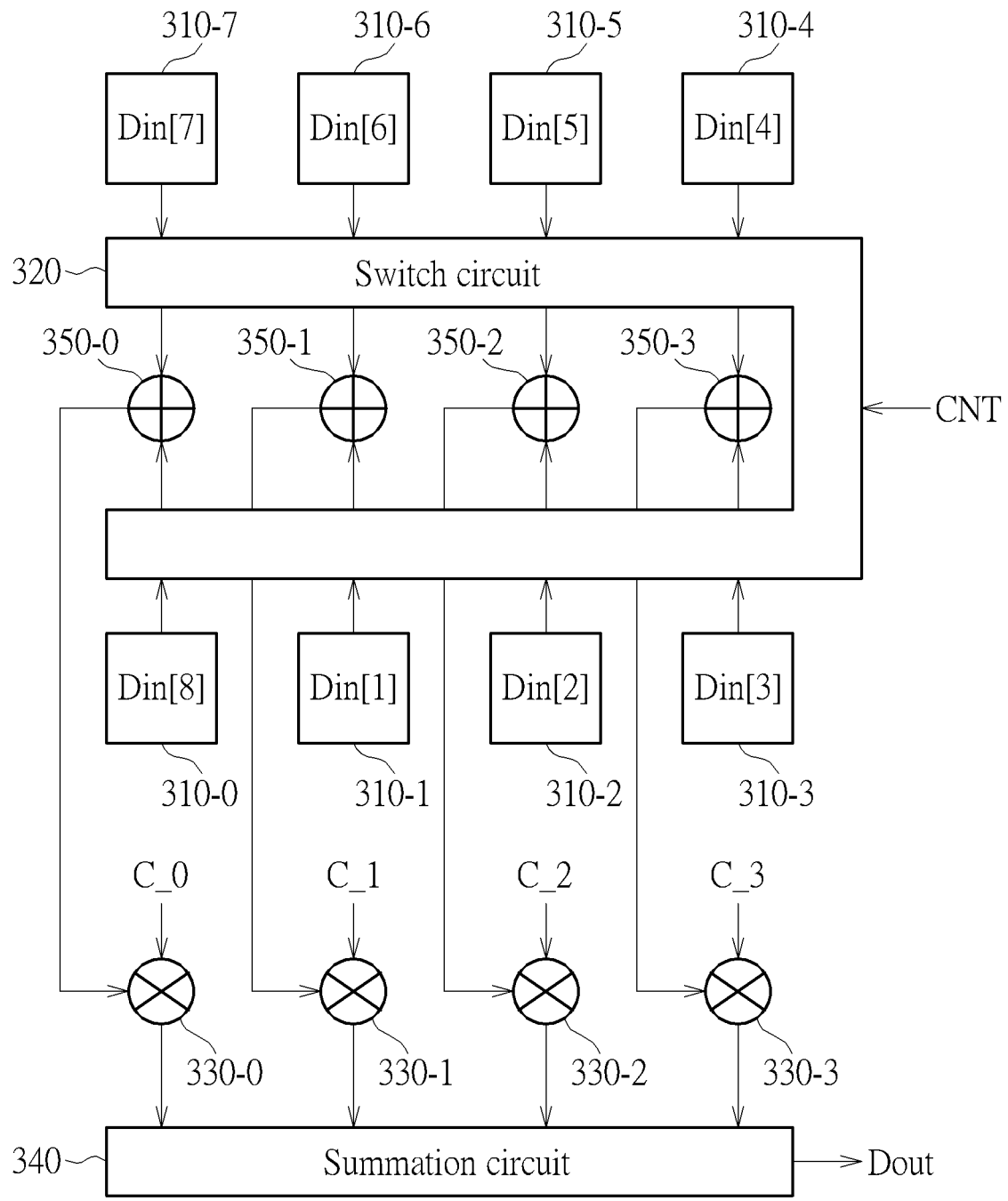
FIG. 3 is a schematic diagram of a filter circuit according to a second embodiment of the invention.

FIG. 3 is a schematic diagram of a filter circuit according to a second embodiment of the invention. The filter circuit 300 may comprise a plurality of registers 310-0~310-(M-1), a switch circuit 320, a plurality of multipliers 330-0~330-(M/2-1), a plurality of adders 350-0~350-(M/2-1) and a summation circuit 340, where M is a positive even integer and may be set as the number of taps of the filter circuit 300. In this embodiment, the number of taps of the filter circuit 300 is 8. Thus, M=8. Each register is configured to store an input. For example, suppose that the initial input data of the filter circuit 300 is Din[0], Din[1], Din[2], . . . and Din[7], the inputs Din[0], Din[1], Din[2], . . . and Din[7] are respectively stored in the registers 310-0, 310-1, 310-2, . . . 310-7.

In this embodiment, the filter circuit 300 has a linear symmetric structure. Therefore, the input data that is expected to be multiplied by the same coefficient will be added together first via the adders 350-0~350-3 and then provided to the multipliers 330-0~330-3. The multipliers 330-0~330-3 respectively generate a multiplication result according to received input and a corresponding coefficient (for example, one of the coefficients C_0-C_3). The summation circuit 340 is coupled to the multipliers 330-0~330-3 to sum up the multiplication results to generate an output Dout.

In the second embodiment of the invention, the switch circuit 320 is also configured in the filter circuit 300 to receive the inputs that are currently registered in the registers from the plurality of registers 310-0~310-7 as a series of registered inputs in each operation and adjust arrangement of the inputs of the series of registered inputs according to a count value CNT to generate a series of rearranged inputs. The series of rearranged inputs will be respectively provided to the adders 350-0~350-3 as the corresponding input.

Operations of the filter circuit 300 are similar to that of the filter circuit 100, and the difference is in that two inputs that are expected to be multiplied by the same coefficient will be added via the adder first and then multiplied by the coefficient, so as to reduce the number of multiply operations. Therefore, the linear symmetric structure is presented. The operations of the switch circuit 320 are the same as that of the switch circuit 120 when the numbers of taps are the same. Thus, the details are omitted here for brevity.

Figure 4:
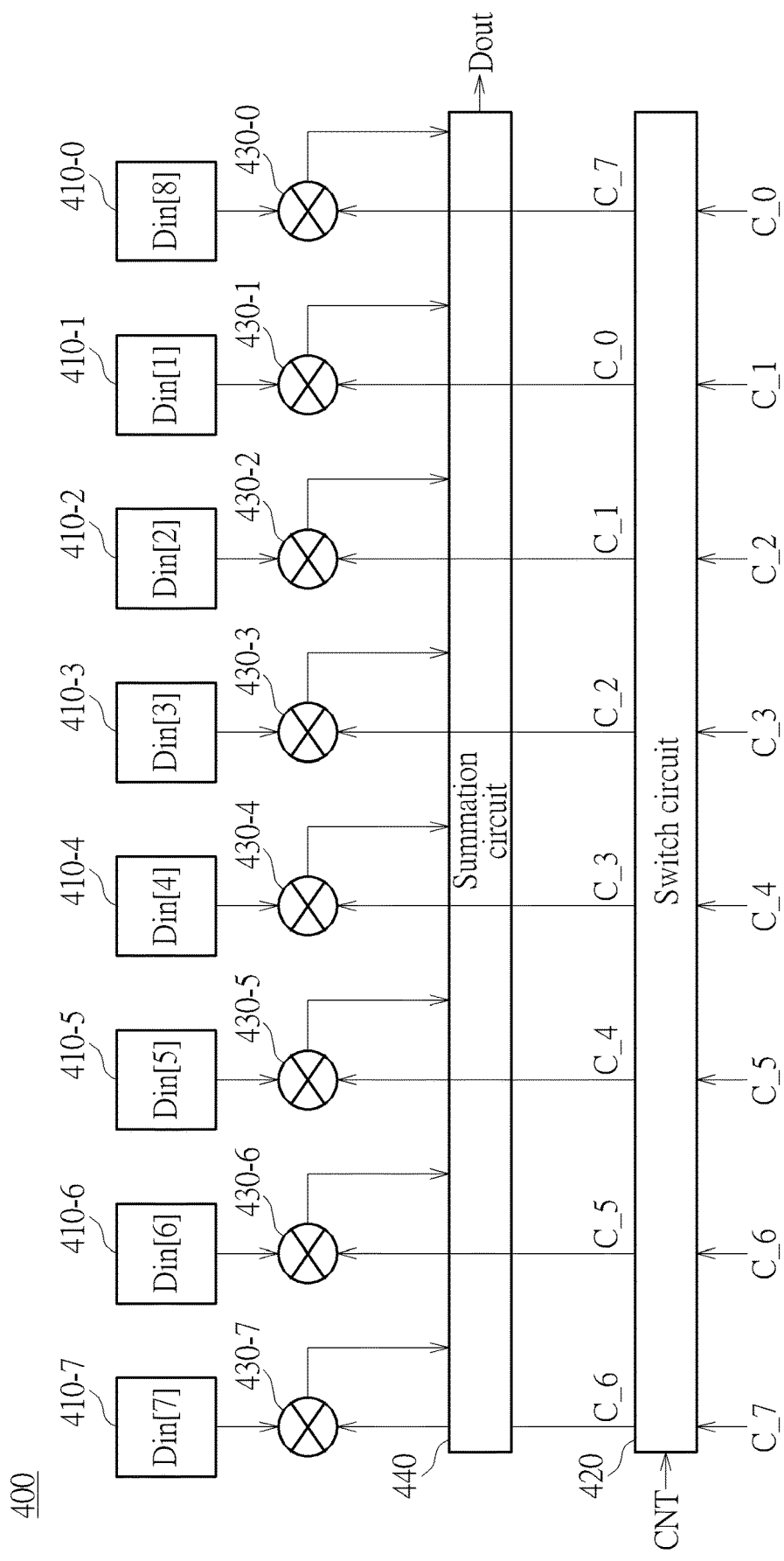
FIG. 4 is a schematic diagram of a filter circuit according to a third embodiment of the invention.

FIG. 4 is a schematic diagram of a filter circuit according to a third embodiment of the invention. The filter circuit 400 may comprise a plurality of registers 410-0~410-(M−1), a switch circuit 420, a plurality of multipliers 430-0~430-(M−1) and a summation circuit 440, where M is a positive integer and may be set as the number of taps of the filter circuit 400. In this embodiment, the number of taps of the filter circuit 400 is 8. Thus, M=8. Each register is configured to store an input. For example, suppose that the initial input data of the filter circuit 400 is Din[0], Din[1], Din[2], . . . and Din[7], the inputs Din[0], Din[1], Din[2], . . . and Din[7] are respectively stored in the registers 410-0, 410-1, 410-2, . . . 410-7. The multipliers 430-0~430-7 may respectively multiply a received input Din[n] and a corresponding coefficient (for example, one of the coefficients C_0~C_7) together to generate a multiplication result. The summation circuit 440 is coupled to the multipliers 430-0~430-7 and configured to sum up the multiplication results to generate an output Dout.

In the third embodiment of the invention, the switch circuit 420 is coupled to the multipliers 430-0~430-7 and configured to receive a series of coefficients. As shown in FIG. 4, the series of coefficients received by the switch circuit 420 is {C_7, C_6, C_5, C_4, C_3, C_2, C_1, C_0}. In an embodiment, the series of coefficients may be stored in a memory device or one or more registers (not shown in FIG. 4). In another embodiment, the series of coefficients may be generated by a coefficient providing circuit (not shown in FIG. 4) based on one or more default values.

Since the coefficients of the filter circuit 400 may be provided by the aforementioned device and they usually remain unchanged during the filtering operations, the series of coefficients received by switch circuit 420 actually has a predetermined arrangement. In the third embodiment of the invention, the switch circuit 420 is configured to adjust the arrangement of the series of coefficients to generate a series of rearranged coefficients. The coefficients in this series of rearranged coefficients will be respectively provided to the multipliers 430-0~430-7 as the corresponding coefficient.

Similar to the aforementioned embodiments, when the filter circuit 400 is activated, the count value CNT may be set to an initial value (for example, 0) and will be accumulated every time when the filter circuit 400 receives an input data. When the count value CNT is smaller than the number of taps M, the switch circuit 420 does not function. The switch circuit 420 starts to function in response to the count value CNT when the count value CNT becomes not smaller than the number of taps M, and is configured to adjust arrangement of the series of coefficients to generate a series of rearranged coefficients according to a modulo result of CNT and M (for example, an operation result of (CNT mod M)).

In the embodiments of the invention, when the filter circuit 400 receives a new input at the time when all the registers 410-0, 410-1, 410-2, . . . 410-7 have already been written with input data, the new input will be written in one of the registers 410-0~410-7, for example, the one which stores the oldest (earliest) input among the inputs currently being stored in the registers, so as to replace the oldest input. As the example shown in FIG. 4, in the latest operation period, when the input Din[8] is input to the filter circuit 400, the count value CNT is accumulated to 9 and the input Din[8] will be written in the register 410-0 to replace the oldest input Din[0] among the current registered inputs.

Since the operation of the filter circuit 400 is to respectively multiply the input data, in an order from the latest one to the oldest one, by one of the coefficients C_(M−1)~C_0 (for example, C_7~C_0 in this example), in the third embodiment of the invention, the switch circuit 420 is configured to adjust arrangement of the series of coefficients C_7~C_0, so that the input data will be correctly multiplied by the corresponding coefficient. For example, the latest input and the coefficient C_(M−1) will be multiplied together, the oldest input and the coefficient C_0 will be multiplied together, and the rest can be deduced by analogy.

In this example, the series of inputs currently registered by the registers is {Din[7], Din[6], Din[5], Din[4], Din[3], Din[2], Din[1], Din[8]}. Since the current modulo result of CNT and M is 1 (9 mod 8=1), the switch circuit 420 rearranges the series of coefficients by performing one data shift to shift one coefficient to the left in a cyclic manner (that is, adjust the arrangement of the coefficients), so as to generate a series of rearranged coefficients {C_6, C_5, C_4, C_3, C_2, C_1, C_0, C_7}.

The coefficients in the series of rearranged coefficients will be respectively provided to the multiplier 430-7~430-0 as the corresponding input. In this manner, the latest input Din[8] and the coefficient C_7 will be multiplied together, the oldest input D[1] and the coefficient C_0 will be multiplied together, and the rest inputs will be multiplied by the corresponding coefficient as well, and the filter operation of the current operation period is completed.

Figure 5:
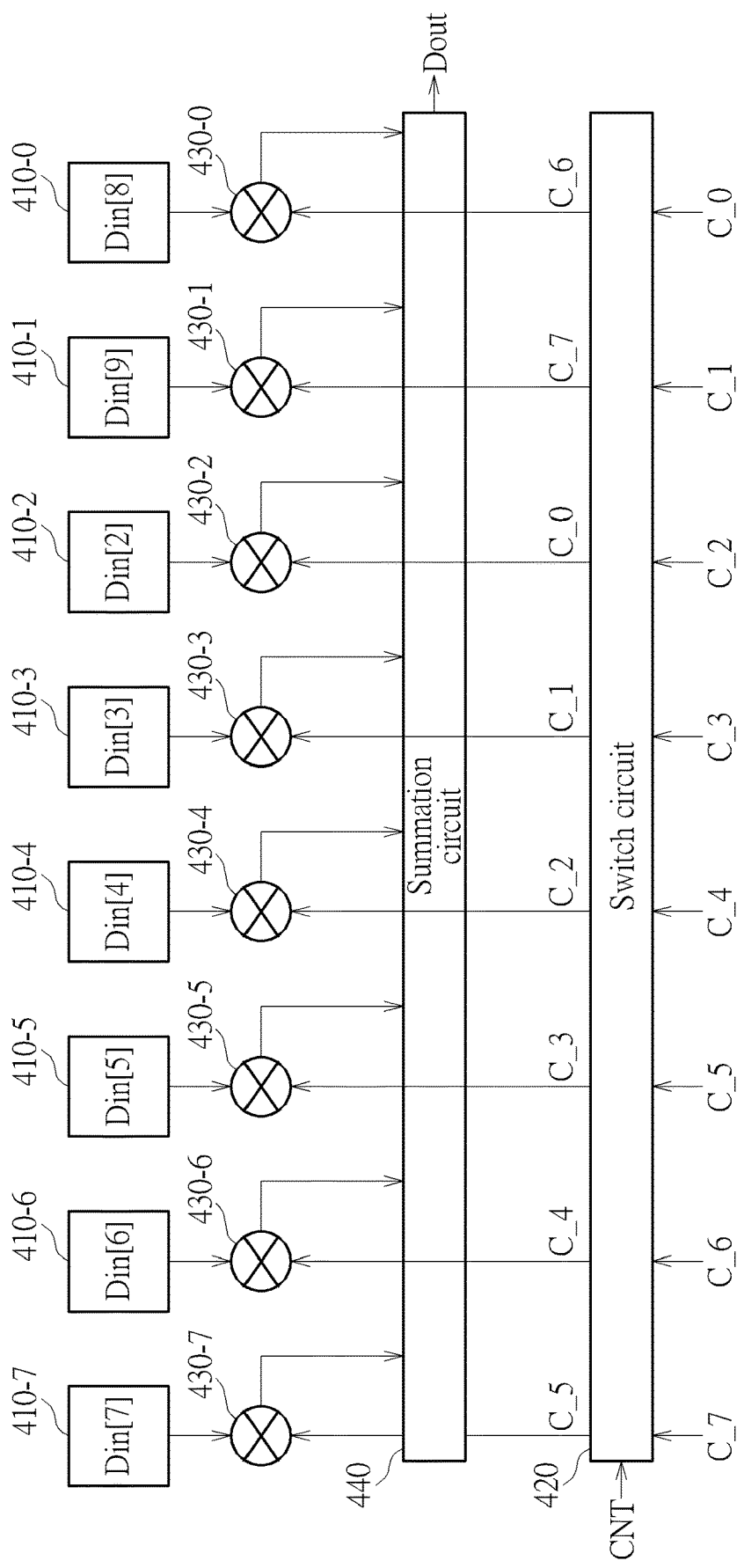
FIG. 5 is a simplified diagram showing the data rearrangement operation of the switch circuit in a next operation period according to an embodiment of the invention.

FIG. 5 is a simplified diagram showing the data rearrangement operation of the switch circuit 420 in a next operation period according to an embodiment of the invention. Similarly, in the next operation period, the input Din[9] is input to the filter circuit 400 and written in the register 410-1 to replace the oldest input Din[1] among the currently registered inputs, and the count value CNT is now accumulated to 10. The switch circuit 120 receives the currently registered inputs from the registers 110-7~110-0 as a series of registered inputs and adjust arrangement of the inputs of the series of registered inputs according to a modulo result of CNT and M.

In this example, the series of registered inputs received by the switch circuit 120 comprises {Din[7], Din[6], Din[5], Din[4], Din[3], Din[2], Din[9], Din[8]} and count value is accumulated to 10. Since the current modulo result of CNT and M is 2 (10 mod 8=2), the switch circuit 420 rearranges the series of coefficients{C_7, C_6, C_5, C_4, C_3, C_2, C_1, C_0} by performing two data shift to shift two coefficients to the left in a cyclic manner, so as to generate a series of rearranged coefficients {C_5, C_4, C_3, C_2, C_1, C_0, C_7, C_6}. The coefficients in this series of rearranged coefficients will be respectively provided to the multiplier 430-7~430-0 as the corresponding input. In this manner, the latest input Din[9] and the coefficient C_7 will be multiplied together, the oldest input D[2] and the coefficient C_0 will be multiplied together, and the rest inputs will be multiplied by the corresponding coefficient as well, and the filter operation of the current operation period is completed.

In the conventional filter circuits, since the M input data have to be respectively multiplied by the coefficients $C\_(M-1)\sim C\_0$ in the order from the latest one to the oldest one, every time when new input data arrives, besides the register storing the oldest data, the remaining registers have to transfer the input data stored therein to the adjacent register. For example, the $0^{th}$ register will discard the input data stored therein, the first register will transfer the input data stored therein to the $0^{th}$ register, the second register will transfer the input data stored therein to the first register, . . . the $(M-1)^{th}$ register will transfer the input data stored therein to the $(M-2)^{th}$ register, and the $M^{th}$ register is configured to receive the latest input data. Because such a large amount of data transfer has to be performed in each operation period, the registers in the traditional filter circuit needs to be continuously triggered when the signal is continuously input, which causes power consumption problems.

Different from the conventional filter circuit design, in the embodiments of the invention, by configuring the switch circuit, there is no need to transfer the input stored in one register to the adjacent register in response to a new input being received by the filter circuit, and there is no need to transfer the inputs among the registers in response to the reception of the new input. In this manner, the power consumption problems can be solved.

In addition, different from the conventional filter circuit design, since there is no need to transfer data among the registers, the registers can be disconnected from each other in the embodiments of the invention. In addition, since the invention does not use the same register as the traditional design to receive the latest data, in the embodiments of the invention, the inputs received at different time are written in different registers.

In addition, according to an embodiment of the invention, after the switch circuit starts to function, the amount of data shift may be determined according to a modulo result of CNT and M, or may be determined according to a modulo result of CNT and M after resetting the count value CNT. In the latter's implementation, when the count value CNT equals to M, the switch circuit may start to function and the count value CNT may be reset to 0. The reset period of the count value CNT may be equal to a number of the registers, and is usually equal to the number of taps (M) of the filter circuit. That is, in the latter's implementation, every time when the count value CNT equals to the number of taps M (or, the number of the registers), the count value CNT is reset to 0.

Figure 6:
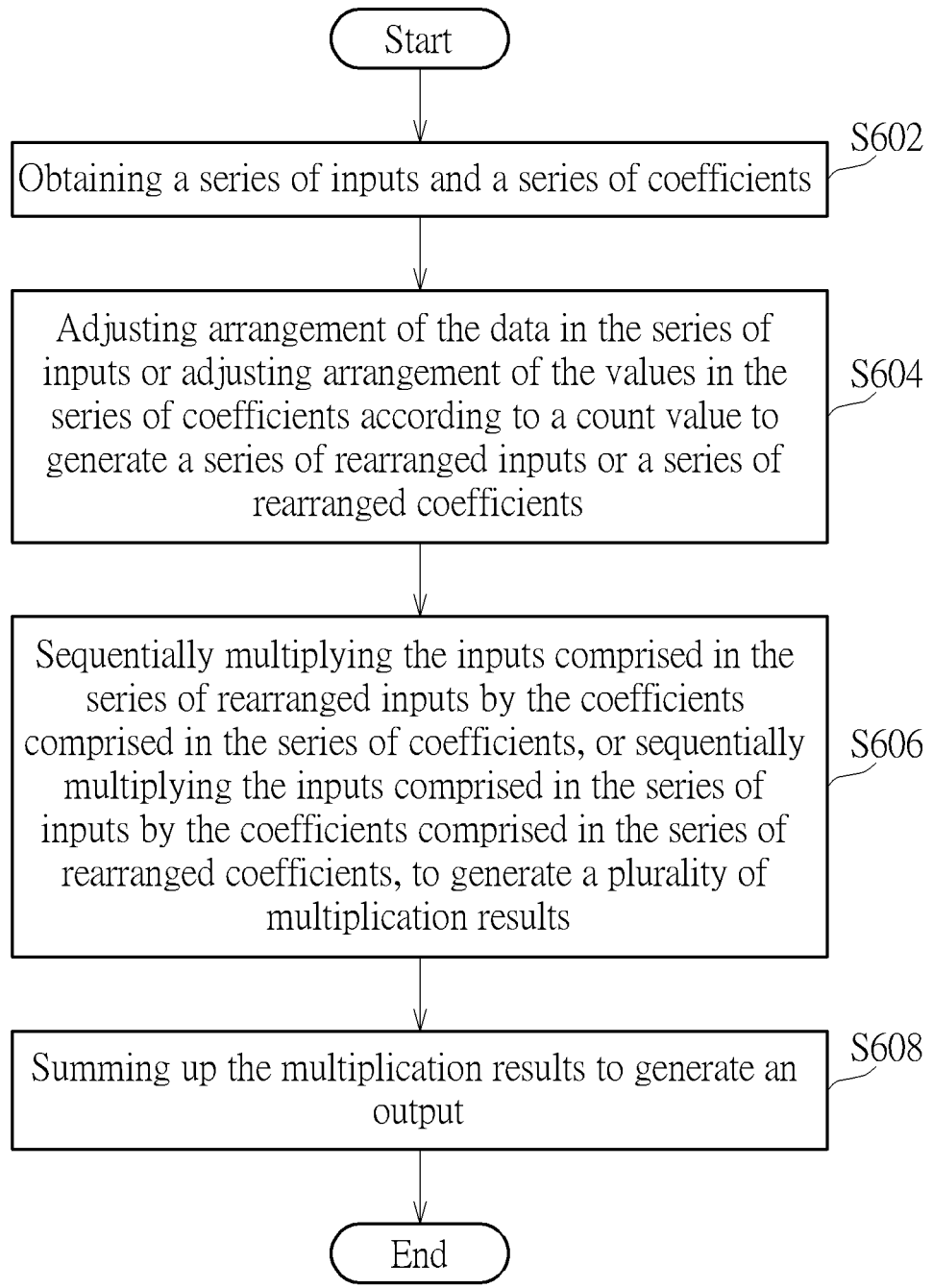
FIG. 6 is a flow chart of a signal processing method according to an embodiment of the invention.

FIG. 6 is a flow chart of a signal processing method according to an embodiment of the invention. The signal processing method is applied for generating at least one output according to a plurality of inputs and a plurality of coefficients, and comprises the following steps:

Step S602: Obtaining a series of inputs and a series of coefficients.

Step S604: Adjusting arrangement of the data (that is, the inputs) in the series of inputs or adjusting arrangement of the values (that is, the coefficients) in the series of coefficients according to a count value to generate a series of rearranged inputs or a series of rearranged coefficients.

Step S606: Sequentially multiplying the inputs comprised in the series of rearranged inputs by the coefficients comprised in the series of coefficients, or sequentially multiplying the inputs comprised in the series of inputs by the coefficients comprised in the series of rearranged coefficients, to generate a plurality of multiplication results.

Step S608: Summing up the multiplication results to generate an output.

As discussed above, in the embodiments of the invention, different registers will be arranged to receive the latest data at different time, so as to replace the oldest input data.

The proposed filter circuit design may also be flexibly applied in the cases when the number of taps of the filter circuit is not equal to the number of registers comprised in the filter circuit. In such cases, only the operations of the switch circuit have to be adjusted.

Figure 7:
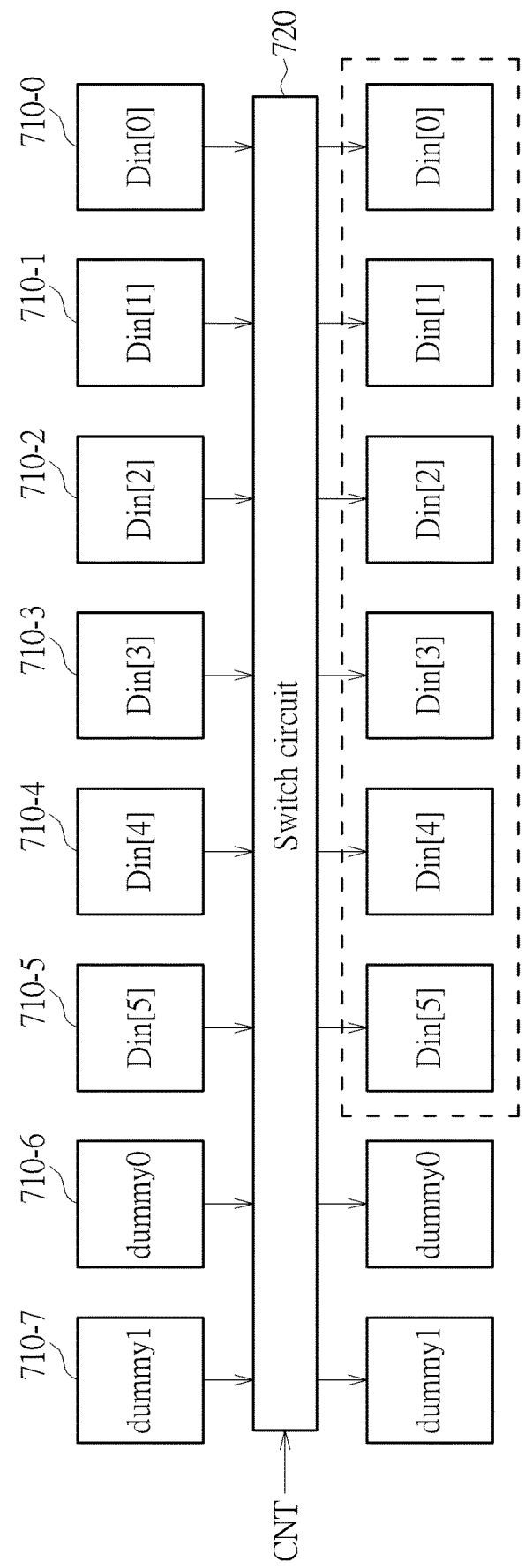
FIG. 7~FIG. 9 are the simplified diagrams showing the operations of adjusting the data arrangement of the switch circuit in different operation periods according to the fourth embodiment of the invention.
Figure 8:
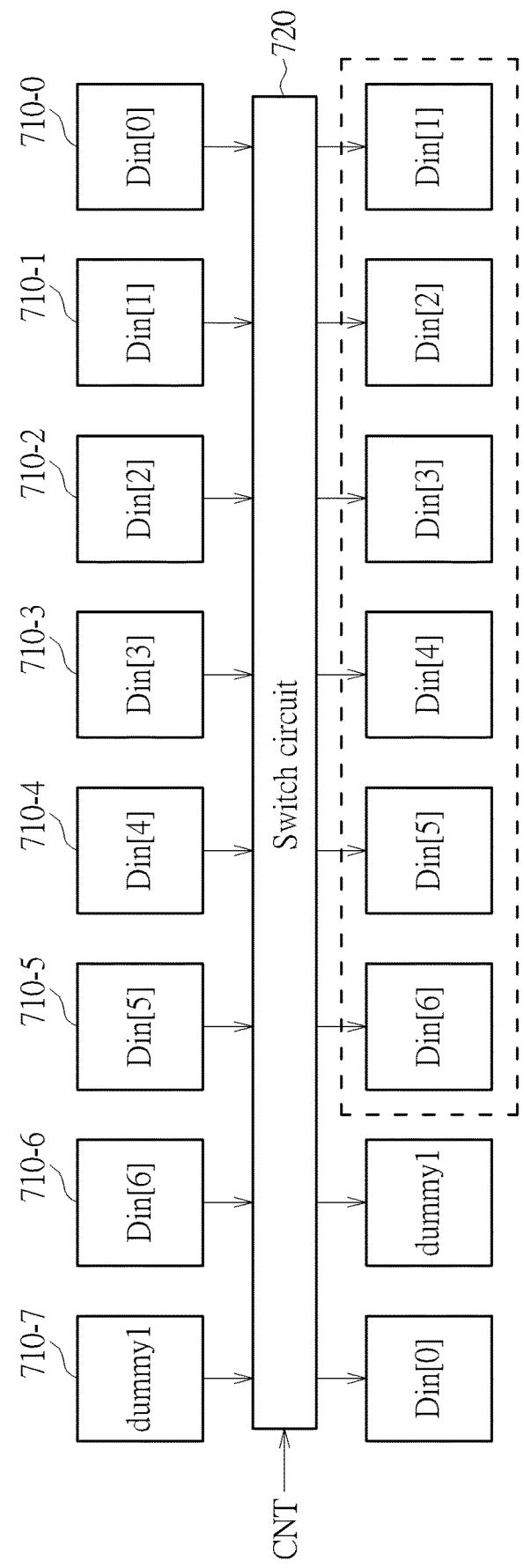
Figure 9:
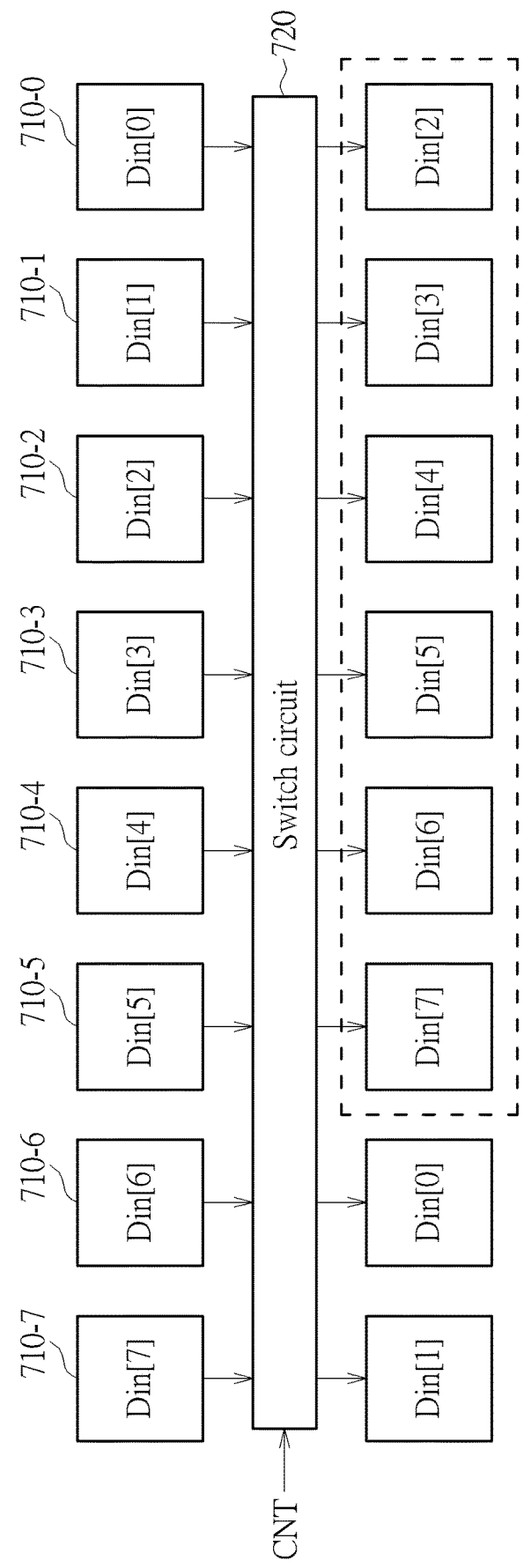

FIG. 7~FIG. 9 are the simplified diagrams showing the operations of adjusting the data arrangement of the switch circuit in different operation periods according to the fourth embodiment of the invention. It should be understood that those portions of the filter circuit not shown in the figures and their corresponding operations are all deducible from FIG. 1.

In this embodiment, the number of registers X is greater than the number of taps Y of the filter circuit. For example, X=8 and Y=6. Since the number of registers X=8, the switch circuit 720 may be designed to have a structure capable of performing data rearrangement operation for 8 data. The following paragraphs will explain how to adjust the data arrangement of the inputs under the same structure of the switch circuit as discussed above, so as to complete the filtering operation for 6 inputs.

Suppose that the initial inputs of the filter circuit comprises the data Din[0], Din[1], Din[2], . . . Din[5], which are respectively stored in the registers 710-0, 710-1, 710-2, . . . 710-5, and the remaining registers 710-6 and 710-7 store dummy data dummy0 and dummy1.

The count value CNT may be accumulated in response to reception of the input data from an initial value (for example, 0). When the count value CNT is smaller than the number of taps Y, the switch circuit 720 does not function. The switch circuit 720 starts to function in response to the count value CNT when the count value CNT becomes not smaller than the number of taps Y, and is configured to obtain a value by adding the count value CNT and a difference between the number of registers X and the number of taps Y together (that is, [CNT+(X−Y)]), and adjust the arrangement of the series of registered inputs that is currently stored in the registers based on a modulo result of the value and the number of registers X (for example, [CNT+(X−Y)] mod X).

In the operation period as shown in FIG. 7, the count value CNT=6. At this time, since the modulo result is 0 (that is, [6+2] mod 8=0), the switch circuit 720 does not perform data shift. That is, the switch circuit 720 may directly provide former 6 inputs (as the part framed by the dotted line) in the series of inputs {dummy1, dummy0 Din[5], Din[4], Din[3], Din[2], Din[1], Din[0]} to the corresponding multipliers or adders. It should be noted that as will be readily appreciated by the person of ordinary skilled in the art, the operations of providing a portion of the inputs to the corresponding multipliers or adders may be implemented by coupling the output bus of the switch circuit 720 to the corresponding multipliers or adders. Therefore, details are omitted here for brevity. In addition, in this embodiment, since the number of taps Y of the filter circuit is 6, the number of multipliers may be 6 or 3 (in the embodiments of linear symmetric structure).

In the next operation period as shown in FIG. 8, the new input Din[6] is input and written in the register 710-6, so as to replace the dummy data dummy0(which may be regarded as the oldest data in the current operation period) stored therein. Now, the count value CNT=7. The switch circuit 720 may rearrange the series of registered inputs {dummy1, Din[6], Din[5], Din[4], Din[3], Din[2], Din[1], Din[0]} by performing one data shift to shift one data to the right in a cyclic manner (that is, adjust the arrangement of the inputs), so as to generate a series of rearranged inputs {Din[0], dummy1, Din[6], Din[5], Din[4], Din[3], Din[2], Din[1]}, and provide the former 6 inputs (as the part framed by the dotted line) to the corresponding multipliers.

Similarly, in the next next operation period as shown in FIG. 9, the new input Din[7] is input and written in the register 710-7, so as to replace the dummy data dummy1 (which may be regarded as the oldest data in the current operation period) stored therein. Now, the count value CNT=8. The switch circuit 720 may rearrange the series of registered inputs by performing two data shift to shift two data to the right in a cyclic manner (that is, adjust the arrangement of the inputs), so as to generate a series of rearranged inputs {Din[1], Din[0], Din[7], Din[6], Din[5], Din[4], Din[3], Din[2]}, and provide the former 6 inputs (as the part framed by the dotted line) to the corresponding multipliers.

In other words, in the embodiments of the invention, when a switch circuit is already designed to have a structure capable of performing data rearrangement operation for X data, the switch circuit can still be utilized in the filter circuit in which the number of taps Y is smaller than the number of registers X. In the applications of Y<X, every time when the filter circuit receives a new input, the new input will be written in the register which store the oldest input among the inputs currently stored in the registers, so as to replace the oldest input. Therefore, the inputs stored in the registers are not transferred among the registers in response to the reception of the new input of the filter circuit. In addition, the switch circuit 720 determines the amount of data shift according to a modulo result of [CNT+(X−Y)] and M, adjusts arrangement of inputs in the series of registered input currently obtained, and provides Y rearranged inputs to the corresponding multipliers or adders. Therefore, in the cases when the number of taps of the filter circuit is not equal to the number of registers comprised in the filter circuit, only the operations of the switch circuit have to be adjusted. In this manner, the switch circuit that has already been well designed can still be applicable to the filter circuit in such cases.

In the embodiments of the invention, the switch circuit may be a barrel shifter.

Figure 10:
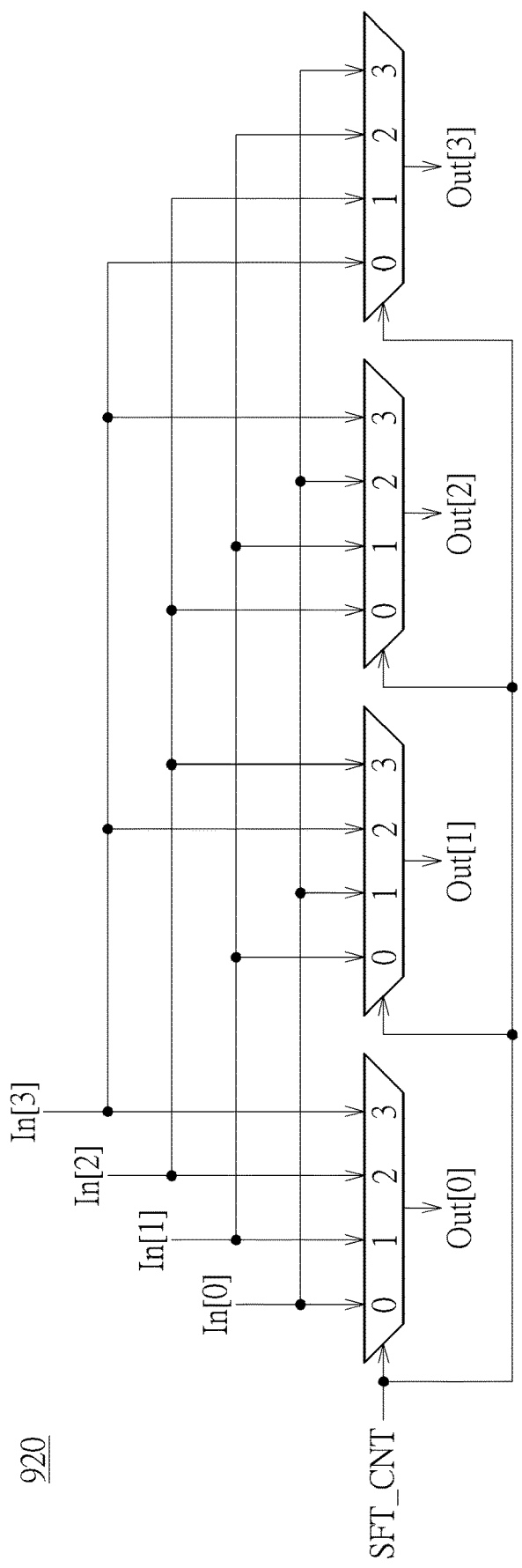
FIG. 10 is a schematic diagram of a switch circuit according to an embodiment of the invention.

FIG. 10 is a schematic diagram of a switch circuit according to an embodiment of the invention. In this embodiment, the switch circuit 920 may be applied in the filter circuit having 4 taps. The switch circuit 920 may comprise a plurality of multiplexers. the multiplexers respectively select and output one of the inputs In[0]~In[3] as the corresponding outputs Out[0]~Out[3] according to the received shift count SFT_CNT, where the inputs In[0]~In[3] is a series of registered inputs or a series of coefficients received by the switch circuit in the aforementioned embodiments, and the outputs Out[0]~Out[3] is a series of rearranged input or a series of rearranged coefficient generated by the switch circuit in the aforementioned embodiments. The shift count SFT_CNT may be the count value CNT or a value calculated based on the count value CNT. As will be readily appreciated by the person of ordinary skilled in the art, the design of switch circuit for different number of taps can be deduced based on the switch circuit as shown in FIG. 10. Therefore, the descriptions are omitted here for brevity.

As discussed above, in the embodiments of the invention, by configuring the switch circuit, there is no need to trigger the registers in the filter circuit in response to reception of each new input, and the power consumption problems in the conventional design can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter circuit, comprising:
a plurality of registers, each being configured to store an input;
a switch circuit, coupled to the registers and configured to receive the inputs from the registers as a series of registered inputs and adjust arrangement of the inputs of the series of registered inputs to generate a series of rearranged inputs according to a count value, wherein the count value is accumulated in response to reception of a new input of the filter circuit;
a plurality of multipliers, coupled to the switch circuit, wherein the inputs of the series of rearranged inputs are sequentially provided to the multipliers and each multiplier is configured to generate a multiplication result according to received input and a coefficient; and
a summation circuit, coupled to the multipliers and configured to sum up the multiplication results to generate an output;
wherein when the filter circuit receives the new input, the new input is written in one of the registers to replace the oldest input among the inputs currently being stored in the registers.

2. The filter circuit of claim 1, wherein the inputs stored in the registers are not transferred among the registers in response to the reception of the new input of the filter circuit.

3. The filter circuit of claim 1, wherein the inputs received at different time are written in different registers.

4. The filter circuit of claim 1, wherein a reset period of the count value is equal to a number of the registers.

5. A filter circuit, comprising:
a plurality of registers, each being configured to store an input;
a switch circuit, configured to adjust arrangement of a series of coefficients according to a count value to generate a series of rearranged coefficients, wherein the count value is accumulated in response to reception of a new input of the filter circuit;
a plurality of multipliers, coupled to the switch circuit and the registers and configured to receive the inputs from the registers and receive the series of rearranged coefficients from the switch circuit, wherein each multiplier is configured to generate a multiplication result according to the received input and the received coefficient; and
a summation circuit, coupled to the multipliers and configured to sum up the multiplication results to generate an output;
wherein when the filter circuit receives the new input, the new input is written in one of the registers to replace the oldest input among the inputs currently being stored in the registers.

6. The filter circuit of claim 5, wherein the inputs stored in the registers are not transferred among the registers in response to the reception of the new input of the filter circuit.

7. The filter circuit of claim 5, wherein the inputs received at different time are written in different registers.

8. The filter circuit of claim 5, wherein a reset period of the count value is equal to a number of the registers.

9. A signal processing method, for generating at least one output according to a plurality of inputs and a plurality of coefficients, comprising:
- obtaining a series of inputs and a series of coefficients, wherein the series of inputs comprises the plurality of inputs and the series of coefficients comprises the plurality of coefficients;
- adjusting arrangement of the series of inputs or the series of coefficients according to a count value to generate a series of rearranged inputs or a series of rearranged coefficients;
- sequentially multiplying the inputs comprised in the series of rearranged inputs by the coefficients comprised in the series of coefficients or sequentially multiplying the inputs comprised in the series of inputs by the coefficients comprised in the series of rearranged coefficients to generate a plurality of multiplication results;
- summing up the multiplication results to generate the at least one output; and
- storing the inputs in a plurality of registers of a filter circuit;
- wherein when the filter circuit receives a new input, the new input is written in the register which stores the oldest input among the inputs currently stored in the registers to replace the oldest input.

10. The signal processing method of claim 9, wherein the inputs stored in the registers are not transferred among the registers in response to reception of a new input of the filter circuit.

11. The signal processing method of claim 9, further comprising:
- configuring different registers to receive the inputs received at different time.

12. The signal processing method of claim 9, wherein a reset period of the count value is equal to a number of the registers.

* * * * *